(12) United States Patent
Ito

(10) Patent No.: US 6,849,938 B2
(45) Date of Patent: Feb. 1, 2005

(54) CERAMIC SUBSTRATE FOR SEMICONDUCTOR PRODUCTION AND INSPECTION

(75) Inventor: Yasutaka Ito, Gifu (JP)

(73) Assignee: IBIDEN Co., Ltd., Ogaki (JP)

( * ) Notice: Subject to any disclaimer, the term of this patent is extended or adjusted under 35 U.S.C. 154(b) by 1 day.

(21) Appl. No.: 10/362,941

(22) PCT Filed: Aug. 24, 2001

(86) PCT No.: PCT/JP01/07241
§ 371 (c)(1),
(2), (4) Date: Apr. 28, 2003

(87) PCT Pub. No.: WO02/19399
PCT Pub. Date: Mar. 7, 2002

(65) Prior Publication Data
US 2004/0065881 A1 Apr. 8, 2004

(30) Foreign Application Priority Data
Aug. 31, 2000 (JP) ........................................ 2000-263325

(51) Int. Cl.⁷ ............................. H01L 23/15; H05B 3/10
(52) U.S. Cl. ........................ 257/703; 257/701; 257/705; 219/552; 219/520
(58) Field of Search ................................ 257/701, 703, 257/705; 219/552, 520

(56) References Cited

U.S. PATENT DOCUMENTS

| | | | |
|---|---|---|---|
| 5,800,618 A | * | 9/1998 | Niori et al. ............... 118/723 E |
| 5,831,248 A | | 11/1998 | Hojyo et al. |
| 5,886,863 A | * | 3/1999 | Nagasaki et al. ............ 361/234 |
| 6,028,762 A | * | 2/2000 | Kamitani ..................... 361/234 |
| 6,465,763 B1 | | 10/2002 | Ito et al. |
| 6,475,606 B2 | | 11/2002 | Niwa |
| 6,507,006 B1 | | 1/2003 | Hiramatsu et al. |
| 2002/0055021 A1 | * | 5/2002 | Niwa ......................... 428/698 |

FOREIGN PATENT DOCUMENTS

| | | |
|---|---|---|
| JP | 04 249090 | 9/1992 |
| JP | 04 324276 | 11/1992 |
| JP | 10 229114 | 8/1998 |
| JP | 10-229114 | 8/1998 |
| JP | 2000-114354 | 4/2000 |
| JP | 2000 114354 | 4/2000 |

\* cited by examiner

Primary Examiner—Jasmine Clark
(74) Attorney, Agent, or Firm—Oblon, Spivak, McClelland, Maier & Neustadt, P.C.

(57) ABSTRACT

An object of the present invention is to provide a ceramic substrate for a semiconductor producing/examining device, capable of controlling the temperature of a resistance heating element, thereby suitably controlling the temperature of a semiconductor wafer placed on a ceramic substrate or the like and evenly heating the semiconductor wafer. The ceramic substrate for a semiconductor producing/examining device according to the present invention comprises at least a resistance heating element formed on a surface thereof or inside thereof, wherein a region: where a semiconductor wafer is directly placed; or where a semiconductor wafer is placed apart from the surface thereof while keeping a given distance, exists inside a surface region corresponding to the region where said resistance heating element is formed.

2 Claims, 10 Drawing Sheets

(a)

(b)

(a)

(b)

(c)

(d)

CERAMIC SUBSTRATE FOR SEMICONDUCTOR PRODUCTION AND INSPECTION

CROSS REFERENCE TO RELATED APPLICATION

This application is a national stage application of PCT/JP01/07241, filed on Aug. 24, 2001 and claiming priority of JP 2000-263325, filed on Aug. 31, 2000, the content of which is incorporated herein by reference.

TECHNICAL FIELD

The present invention relates to a ceramic substrate for a semiconductor producing/examining device, which comprises a resistance heating element on a surface thereof or inside thereof and which is used for a hot plate (ceramic heater), electrostatic chuck, wafer prober and the like.

BACKGROUND ART

Conventionally, a heater, a prober and the like using a substrate made of a metal such as a stainless steel and an aluminum alloy have been employed for a semiconductor producing/examining device including an etching apparatus and a chemical vapor deposition apparatus.

However, such a heater made of a metal has the following problems.

At first, since it is made of a metal, the thickness of the heater plate has to be as thick as about 15 mm. It is because in the case of a thin metal plate, warp and strain and the like are caused due to the thermal expansion attributed to heating and therefore result in break and inclination of a silicon wafer set on the metal plate. However, in the case the heater plate is made thick, there are problems that the heater becomes heavy and bulky.

Further, by changing voltage and electric current to be applied to the resistance heating elements, the temperature of the face for heating (hereinafter, referred to as a heating face) an object to be heated such as a semiconductor wafer or the like is controlled, however due to the thickness of the metal plate, there occurs another problem that the temperature of the heating plate does not follow quickly the change of the voltage and the electric current to result in difficulty of the temperature control.

Therefore, JP Kokai Hei 4-324276 proposes a hot plate wherein a non-oxide ceramic with a high thermal conduction and strength such as an aluminum nitride as a substrate are used and resistance heating elements and conductor-filled through holes made of tungsten are formed thereto and nichrome wires as external terminals welded thereto.

Since such a hot plate employs a ceramic substrate for a semiconductor producing/examining device with a high mechanical strength even at a high temperature, the thickness of the ceramic substrate can be thinned to lessen the thermal capacity. As a result, it is made possible that the temperature of the ceramic substrate quickly follows the change of the voltage and electric current.

Generally, with respect to such a hot plate, a temperature measuring element is attached to the surface of or inside the ceramic substrate, and after the ceramic substrate is attached to a supporting case made of a metal through a heat insulating ring and the like made of resin, metal wires from a thermocouple and conductive wires from a resistance heating element are pulled out to the outside of the supporting case through a plurality of through holes formed respectively in a bottom plate and connected to a control apparatus and the like and thus the temperature of the ceramic substrate is controlled on the basis of the temperature measured by the temperature measuring element.

SUMMARY OF THE INVENTION

However, in recent years, the diameter of a ceramic substrate becomes larger as 300 mm or more in order to place a silicon wafer having a large diameter thereon, while the thickness thereof becomes thinner as 5 mm or less in order to lower the heat capacity. In the case of heating a ceramic substrate at high temperature, a problem arises that the temperature of a semiconductor wafer which is directly placed on or is placed while keeping a given distance from the surface of the ceramic substrate obtains unevenness.

It is noted that, in this specification, hereinafter, in case a semiconductor wafer is directly placed on the surface of the ceramic substrate or is placed apart from the surface thereof while keeping a given distance, it will be expressed simply as "a semiconductor wafer is placed on the ceramic substrate; or the like", besides the case it is especially expressed as described above.

Inventors of the present invention have enthusiastically made investigations to solve such problems mentioned above. As a result, they found that: one of causes of uneven temperature of a semiconductor wafer is that a resistance heating element is formed in a region of a ceramic substrate corresponding to the portion where the semiconductor wafer is placed or inner region of the portion where the semiconductor wafer is placed and as a result, it becomes difficult to control the temperature in the outer circumferential part of the semiconductor wafer to be heated similarly to the temperature of the inner portion thereof; and consequently it results in uneven temperature of the semiconductor wafer as a whole.

The present inventors have found that, by largely forming a resistance heating element in such a manner that a region where a semiconductor wafer or the like is placed exists inside a surface region corresponding to a region where a resistance heating element is provided at a ceramic substrate, it becomes possible to more evenly heat the semiconductor wafer. Thus, the present inventors have completed the present invention.

More specifically, a ceramic substrate for a semiconductor producing/examining device according to the present invention comprises at least a resistance heating element formed on a surface thereof or inside thereof, wherein a region: where a semiconductor wafer is directly placed; or where a semiconductor wafer is placed apart from the surface thereof while keeping a given distance, exists inside a surface region corresponding to a region where the above-mentioned resistance heating element is formed.

According to the present invention, the resistance heating element is formed in the bottom face of the ceramic substrate or inside thereof and no resistance heating element is formed on the heating face. Thus, the phrase "the surface region corresponding to the region where said resistance heating element is formed" used in the claim means that the region on the heating face of the ceramic substrate at which the region where the resistance heating element is formed on the bottom face or inside the ceramic substrate is shifted vertically. In this invention, hereinafter, the region is simply described as "a region where a resistance heating element is formed."

According to the present invention, as described above, a region: where a semiconductor wafer is placed; or the like, exists inside a region where the resistance heating element is formed. Thus, by controlling the temperature of the resistance heating element, the temperature control within the region: where the semiconductor wafer is placed; or the like, on the heating surface can be carried out relatively easily. Accordingly, by controlling the temperature of the resistance heating element, the temperature control of a semiconductor wafer: placed on the ceramic substrate; or the like, can be performed well to result in even heating of the semiconductor wafer.

Further, in the present invention, it is desirable that the region: where a semiconductor wafer is directly placed; or the like, exists within 0.5 mm or more inside of the outer end of the surface region where the above-mentioned resistance heating element is formed.

In the portion in the vicinity of the outer circumference of the region where the resistance heating element is formed, attributed to heat radiation to the outside, the temperature control is not so easy. However, if the outer circumference of the wafer exists within 0.5 mm or more inside of the outer end of the surface region where the above-mentioned resistance heating element is formed, the wafer is not affected by the a lower temperature region in the outer circumference of the ceramic substrate and the semiconductor wafer can be heated evenly.

It is desirable that the relationship between: a distance "L" from the outer end of the surface region where the above-mentioned resistance heating element is formed to the outer end of a region: where a semiconductor wafer is placed; or the like, and a thickness "1" of the ceramic substrate, satisfies the inequality of "L" (mm)>"1" (mm)/20 (see FIG. 1).

If "L"≦"1"/20, the thickness "1" of the ceramic substrate is so thick as compared with the distance "L" from the outer end of the region where the resistance heating element is formed to the outer end of the region: where the semiconductor wafer is placed; or the like, the semiconductor wafer is affected by the low temperature region in the outer circumference of the ceramic substrate to result in impossibility of the even heating.

BRIEF DESCRIPTIONS OF THE INVENTION

Figure 1:
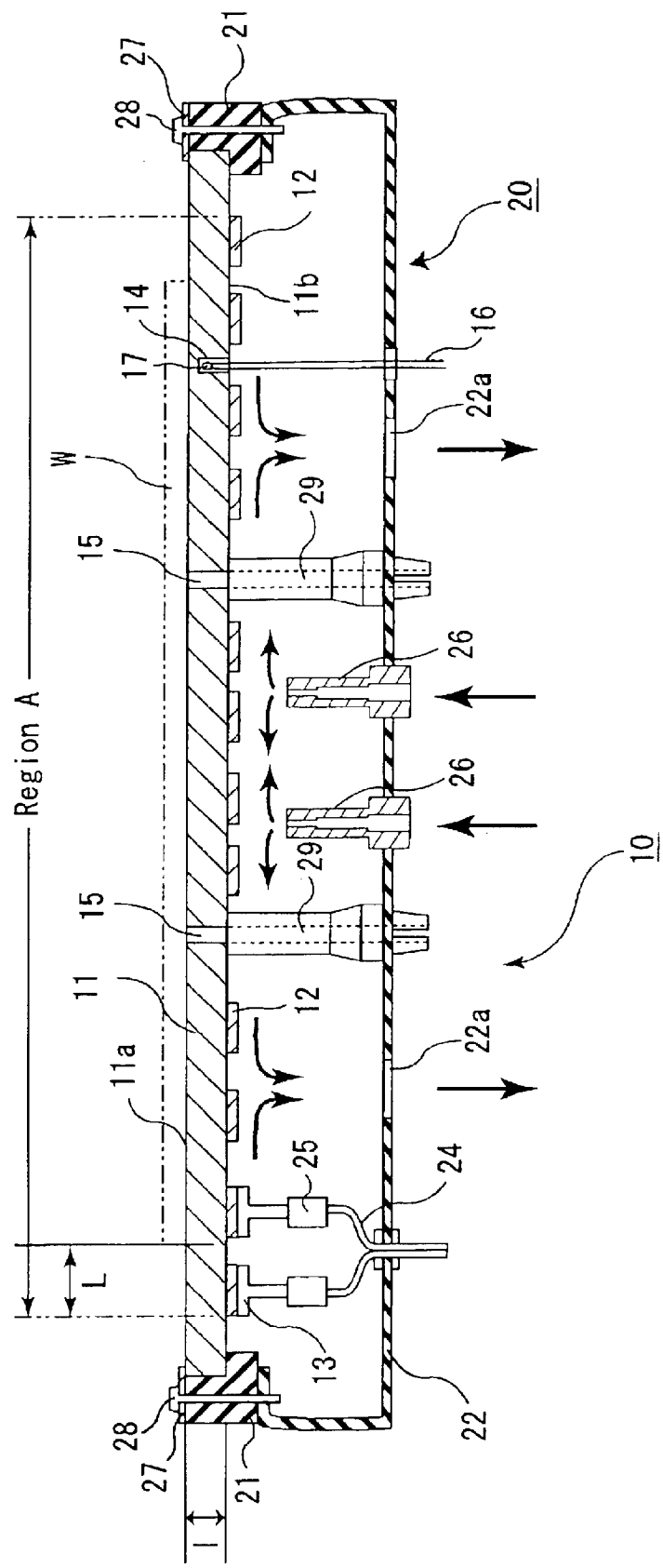
FIG. 1 is a cross-sectional view schematically showing one example of a hot plate using a ceramic substrate according to the present invention.

FIGS. 10(a) to 10(d) are cross-sectional views schematically showing one example of a production method of a ceramic substrate according to the present invention.

FIGS. 11(a) to 11(d) are cross-sectional views schematically showing one example of another production method of a ceramic substrate according to the present invention.

EXPLANATION OF THE SYMBOLS 2 chuck top conductor layer
3, 11, 31, 61, 111, 121 ceramic substrate
5 guard electrode
6 ground electrode
7 groove
8 suction hole
10 hot plate
11a heating face
11b bottom face
12, 32, 51, 66 resistance heating element
12a resistance heating element end portion
13, 33 external terminal
14, 34 bottomed hole
15, 35 through hole
16 lifter pin
17 temperature measuring element
18 solder layer
20 supporting case
21 heat insulating ring
22 heat shielding member
24 conductive wire
25 socket
26 coolant introducing pipe
27 fixing tool
28 bolt
29 guide pipe
37 blind hole
38 conductor-filled through hole
62, 112, 122a, 122b chuck positive electrostatic layer
63, 113, 123a, 123b chuck negative electrostatic layer
52 non electrode formed area
61 heat insulating ring
62 supporting case
62a main body
62b substrate receiving part
62c bottom plate receiving part
64 ceramic dielectric film
63 metal wire
65 bottom plate
64a through hole
65 coolant introducing pipe
66 conductive wire
67 columnar member
69 guide pipe
120 metal covering layer
130 fixing member

DETAILED DISCLOSURE OF THE INVENTION

A ceramic substrate for a semiconductor producing/examining device according to the present invention comprises at least a resistance heating element formed on a surface thereof or inside thereof, wherein a region: where a semiconductor wafer is directly placed; or where a semiconductor wafer is placed apart from the surface thereof while keeping a given distance, exists inside a surface region corresponding to the region where the above-mentioned resistance heating element is formed.

The ceramic substrate according to the present invention comprises at least a resistance heating element formed on a surface thereof or in an inside thereof. In the case where only the resistance heating element formed on a surface thereof or in an inside thereof, the ceramic substrate functions as a hot plate.

On the other hand, in the case where the resistance heating element is formed on a ceramic substrate while an electrostatic electrode is provided therein, the ceramic substrate functions as an electrostatic chuck. In the case where the resistance heating element is formed on a ceramic substrate while a guard electrode and/or a ground electrode are/is provided therein, the ceramic substrate functions as a wafer prober (a ceramic substrate for a wafer prober).

In this specification, at first a hot plate comprising a resistance heating element will be described and, successively, an electrostatic chuck and a wafer prober will be described.

Figure 2:
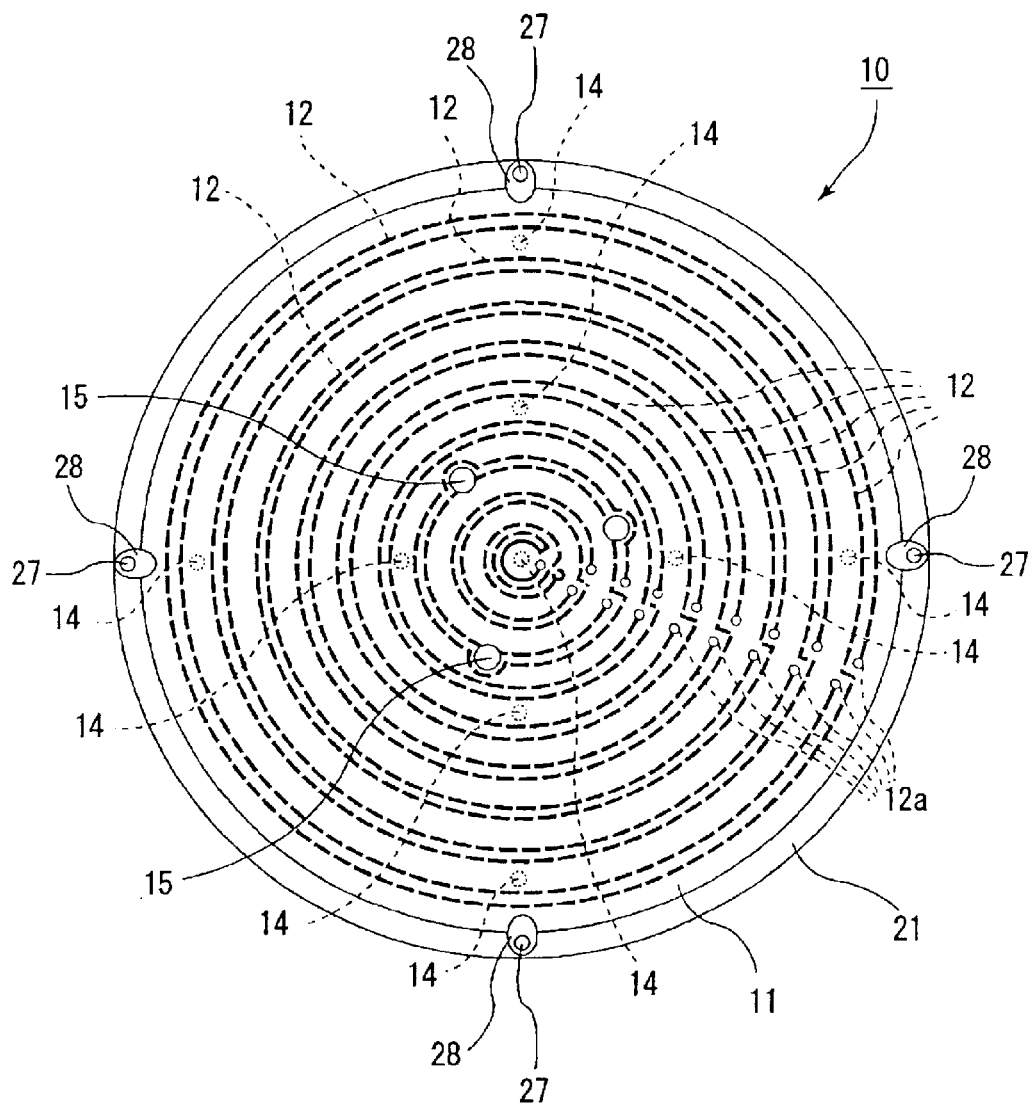
FIG. 2 is a plan view of the hot plate shown in FIG. 1.
Figure 3:
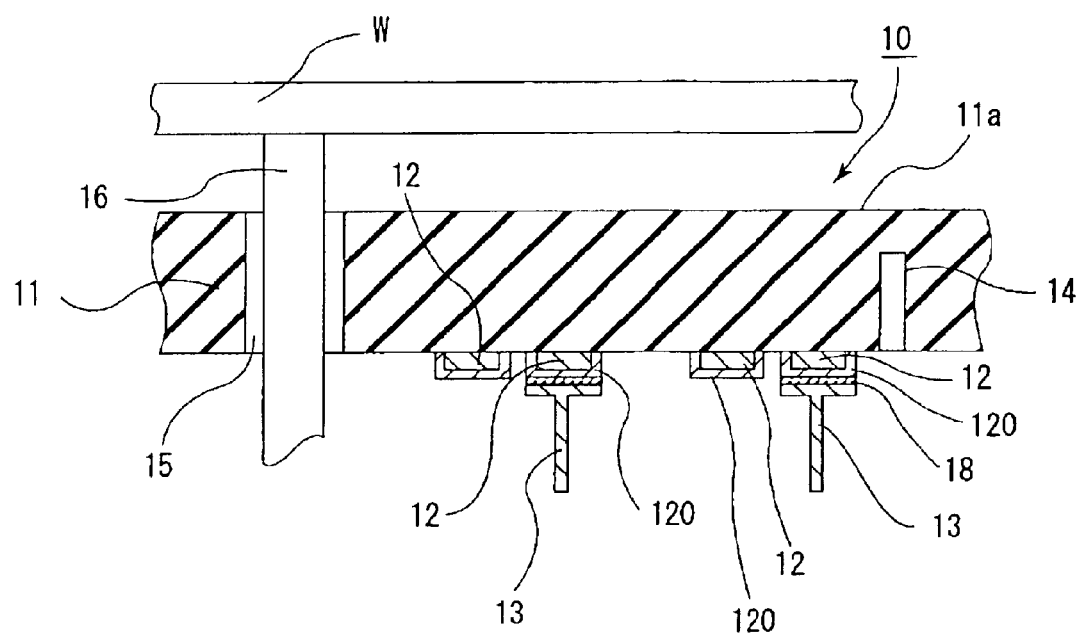
FIG. 3 is a partially enlarged cross-sectional view schematically showing a ceramic substrate forming the hot plate shown in FIG. 1.

FIG. 1 is a cross-sectional view schematically showing one example of a hot plate using a ceramic substrate according to the present invention. FIG. 2 is its plan view and FIG. 3 is a partially enlarged cross-sectional view schematically showing a part thereof.

The hot plate 10 comprises, for example, as shown in FIG. 1, a disk-shaped ceramic substrate 11 and a bottomed cylindrical supporting case 20.

A plurality of concentric-shaped resistance heating elements 12 when viewed in a plan are formed on the bottom face of the ceramic substrate 11 and a plurality of bottomed holes 14 are also formed, and temperature measuring elements 17 having lead wires 16 for measuring the temperature of the ceramic substrate 11 are embedded in the bottomed holes 14.

Further, the supporting case 20 comprises a heat insulating ring 21 having an L-shaped cross-section and a heat shielding member 22 for supporting the heat insulating ring 21, and the heat insulating ring 21 is made of a fluoro resin and the like containing an inorganic fiber and the like and fixed in a circular ring-shaped member formed in an upper part of the heat shielding member 22 by bolts 28. The bolts 28 are attached through fixing tools 27, and the fixing tools 27 reach the ends of the ceramic substrate 11 fitted into the heat insulating ring 21. The ceramic substrate 11 or the like is pressed by the fixing tools 27, so that the ceramic substrate 11 is fixed to the heat insulating ring 21.

It is noted that the bottom part of the heat shielding member 22 may be attached in a detachable manner.

The resistance heating elements 12 comrising a plurality of concentric-shaped circuits are formed, as shown in FIG. 2, on the bottom face 11b of the ceramic substrate 11, and these resistance heating elements 12 are connected in a such manner that mutually adjacently neighboring and concentric ones are coupled to form respective single lines as respective pairs of circuits.

As shown in FIG. 3, in order to prevent oxidation, each of the resistance heating elements 12 is covered with a metal covering layer 120 and ends 12a of the resistance heating elements 12 covered with the metal covering layers 120 are connected to T-shaped external terminals 13 through a solder layer 18. Sockets 25 having conductive wires 24 are further attached to the external terminals 13 and the conductive wires 24 are led out to the outside of the supporting case 20 through seal members fitted in the conductor-filled through holes 22a of the heat shielding member 22.

Further, in the vicinity of the center of the ceramic substrate 11, through holes 15 are provided to let lifter pins 16 for supporting a silicon wafer W pass through and immediately under the through holes 15, guide pipes 29 communicated with the through holes 15 are provided to smoothly let the lifter pins 16 pass through.

Each of the lifter pins 16 is made capable of supporting the silicon wafer W thereon and moving it up and down and accordingly, it is made possible to transport the silicon wafer W to a transporting apparatus, which is not shown, or to receive the silicon wafer W from the transporting apparatus and place and heat the silicon wafer W on the heating face 11a of the ceramic substrate 11 or support and heat the silicon wafer W at a gap of 50 to 2000 $\mu$m from the heating face 11a.

Further, other through holes or concave portions are provided in the ceramic substrate 11 and after supporting pins with sharpened or semi-spherical tip shapes are inserted into the through holes or the concave portions, the supporting pins are fixed while being slightly projected out of the ceramic substrate 11 and the silicon wafer W may be supported by the above-mentioned supporting pins and heated while being kept at 50 to 2000 $\mu$m gap from the heating face 11a.

Additionally, a coolant introducing pipe 26 is provided in the heat shielding member 22, so that it is made possible to control the temperature and the cooling speed of the ceramic substrate 11 by introducing coolant such as air into the coolant introducing pipe 26 through a pipe which is not shown.

In the ceramic substrate 11 according to the present invention, as shown in FIG. 1, since a region where the silicon wafer W is placed is provided inside the region A where the resistance heating elements 12 are formed, by controlling the temperature of the resistance heating elements 12, the temperature of the surface of the ceramic substrate 11 can be made even and, accordingly, it is made easy to control the temperature of the silicon wafer W and evenly heat the silicon wafer W.

It is noted that, with respect to hot plates shown in FIGS. 1 to 3, although the resistance heating elements are provided in the bottom face 11b of the ceramic substrate 11, the resistance heating elements may be provided inside the ceramic substrate.

Also in such a case, similar to the hot plates shown in FIGS. 1 to 3, a silicon wafer can be heated evenly by providing a region: where the silicon wafer W is placed; or the like, inside the region where the resistance heating elements are formed.

Further, with respect to the hot plate 10 shown in FIGS. 1 and 2, the ceramic substrate 11 is fitted in the heat insulating ring 21 on the upper part of the supporting case 20, a ceramic substrate may be placed on the upper part of a supporting case and fixed by fixing members such as bolts in other embodiments.

As the patterns of the resistance heating elements 12, other than the concentric circular shape shown in FIG. 1, swirling, eccentric shape, and combinations of centric circular shape and winding line shape can be employed.

In the above-mentioned hot plates, the number of the circuits comprising the resistance heating elements is not particularly limited if it is 1 or more, however in order to heat the heating face evenly, a plurality of circuits are desirable to be formed and a plurality of combinations of concentric circuits and winding line circuits are preferable.

In the case of forming the resistance heating elements inside a ceramic substrate, the formation position is not particularly limited, however it is preferable to form at least one resistance heating element layer at a position up to 60% of the thickness from the bottom face of the ceramic substrate. It is because heat is diffused while being transmitted to the heating face to easily make the temperature of the heating face even.

In the case of forming the resistance heating elements inside the ceramic substrate or on the bottom face of the ceramic substrate, a conductor containing paste containing a metal or a conductive ceramic is preferable to be used.

That is, in the case of forming resistance heating elements inside the ceramic substrate, after a conductor containing paste layer is formed on a green sheet, other green sheets are laminated and fired to form the resistance heating elements in the inside. On the other hand, in the case of forming the resistance heating elements on the surface, generally, after the ceramic substrate is produced by firing, the conductor containing paste layer is formed on the surface and fired to form the resistance heating elements.

The conductor containing paste is not particularly limited, those containing metal particle or conductive ceramics in order to assure the conductivity and additionally a resin, a solvent, a thickener and the like are preferable.

As the metal particles, for example, a noble metal (gold, silver, platinum, palladium), lead, tungsten, molybdenum, nickel and the like are preferable. They may be used solely or in combination of two or more thereof. Because these metals are relatively hard to be oxidized and have sufficient resistance values to radiate heat.

Examples of the conductive ceramics include carbides of tungsten and molybdenum. They may be used solely or in combination of two or more thereof.

The particle size of the metal particles or the conductive ceramic particles is preferably 0.1 to 100 $\mu$m. Because if it is less than 0.1 $\mu$m, the particles are easily oxidized, whereas if it exceeds 100 $\mu$m, the particles are hard to be sintered and resistance value is increased.

The shape of the metal particles may be spherical or scaly. In the case of using the metal particles, mixtures of the above-mentioned spherical ones and scaly ones may be used.

In the case the metal particles are mixtures of spherical ones and scaly ones, the metal oxides among metal particles are easy to be held and the adhesion of the resistance heating elements and the ceramic substrate and the resistance value is increased and, therefore, it is advantageous.

Examples of the resin to be used for the conductor containing paste include an epoxy resin, a phenol resin and the like. Also, examples of the solvent include isopropyl alcohol and the like. Examples of the thickener include cellulose and the like.

At the time of forming the conductor containing paste for the resistance heating elements on the surface of the ceramic substrate, it is preferable to add a metal oxide other than metal particles to the conductor containing paste to sinter the metal particles and metal oxide. In such a manner, by sintering metal oxide with metal particles, the adhesion of the ceramic substrate and the metal particles is made firm.

The reason for the improvement of the adhesion strength to the ceramic substrate is not clear, however it is supposedly attributed to that the surface of the metal particles and the surface of the ceramic substrate of a non-oxide are slightly oxidized to bear oxide films, respectively, and the oxide films are sintered and laminated together through the metal oxide to result in adhesion strength between the metal particles and the ceramic. Further, in the case of the ceramic substrate is an oxide, naturally the surface is the oxide and therefore, a conductor layer with high adhesion strength can be formed.

As the metal oxide, for example, at least one kind of oxides selected from lead oxide, zinc oxide, silica, boron oxide ($B_2O_3$), alumina, yttria, titania is preferable.

Since these oxides can improve the adhesion strength between the metal particles and the ceramic substrate without increasing the resistance value of the resistance heating elements.

The ratios of the lead oxide, zinc oxide, silica, boron oxide ($B_2O_3$), alumina, yttria, titania are preferably controlled to be 1 to 10 for lead oxide, 1 to 30 for silica, 5 to 50 for boron oxide, 20 to 70 for zinc oxide, 1 to 10 for alumina, 1 to 50 for yttria, 1 to 50 for titania and in total not exceeding 100 parts by weight in 100 parts by weight as a total amount of the metal oxides.

By adjusting the amounts of these oxides within the respective ranges, especially the adhesion strength to the ceramic substrate can be improved.

The addition amount of the metal oxides to the metal particles is preferably 0.1% by weight or more and less than 10% by weight. Also, the area resistivity of the resistance heating elements formed using such a conductor containing paste is preferably 1 to 45 m$\Omega$/□.

It is because if the area resistivity exceeds 45 m$\Omega$/□, the heat generation quantity relative to the applied voltage becomes too high and in the case of a ceramic substrate bearing the resistance heating elements in the surface, the heat generation quantity becomes difficult to control. Additionally, if the addition amount of the metal oxide is 10% by weight or more, the area resistivity exceeds 50 m$\Omega$/□, the heat generation quantity becomes too high to control the temperature and the evenness of the temperature distribution is deteriorated.

In the case the resistance heating elements are formed on the surface of the ceramic substrate, a metal covering layer is preferable to be formed on the surface of the resistance heating elements. This is to prevent resistance value change due to oxidation of the metal sintered body in the inside. The thickness of the metal covering layer to be formed is preferably 0.1 to 10 $\mu$m.

The metal to be used for forming the metal covering layer is not particularly limited if it is a non-oxidative metal and practically, for example, gold, silver, palladium, platinum, nickel and the like can be exemplified. They may be used solely or in combination of two or more thereof. Among them, nickel is preferable.

In the case where the resistance heating elements are formed inside the ceramic substrate, no covering is required since the surface of the resistance heating elements is not oxidized.

The ceramic substrate of the present invention is used preferably at 100° C. or more, more preferably at 200° C. or more.

The material of the ceramic substrate is not particularly limited, and examples thereof may include nitride ceramics, carbide ceramics, oxide ceramics and the like.

Examples of the nitride ceramics include metal nitride ceramics, for example, aluminum nitride, silicon nitride, boron nitride, titanium nitride and the like.

Also, examples of the carbide ceramics include metal carbide ceramics, for example, silicon carbide, zirconium carbide, titanium carbide, tantalum carbide, tungsten carbide and the like.

Examples of the oxide ceramics include metal oxide ceramics, for example, alumina, zirconia, cordierite, mullite and the like.

These ceramics may be used solely or in combination of two or more thereof.

Among the ceramics, nitride ceramics and carbide ceramics are preferable as compared with oxide ceramics, because they have high thermal conductivity.

Further, among the nitride ceramics, aluminum nitride is most preferable. Since the thermal conductivity is 180 W/m·K, which is highest.

The ceramic materials may contain a sintering aid. The sintering aid may include, for example, alkali metal oxides, alkaline earth oxides, rare earth oxides and the like. Among these sintering aids, CaO, $Y_2O_3$, $Na_2O$, $Li_2O$, and $Rb_2O$ are preferable. The content of them is preferably 0.1 to 20% by weight. Further, alumina may be added.

The ceramic substrate is preferable to have brightness of N6 or less on the basis of standards defined by JIS Z 8721. This is because those having such brightness are excellent in radiation heating and shielding property. Further, it is made possible to accurately measure the surface temperature of such a ceramic substrate by a thermo-viewer.

Herein, the brightness value N is defined as follows: the brightness of the ideal black is defined to be 0 and the brightness of the ideal white is defined to be 10 and the brightness values of respective colors are expressed by N0 to N10 by dividing the respective colors into 10 grades at equal sensible brightness difference between the brightness of the black and the brightness of the white.

The practical measurement is carried out by comparing the color with color chips corresponding to N0 to N10. In this case, the numeral of the first decimal place is round to be either 0 or five.

A ceramic substrate having such a characteristic can be obtained by adding carbon in 100 to 5000 ppm to the ceramic substrate. As carbon, there are amorphous carbon and crystalline carbon. The amorphous carbon can suppress the decrease of the volume resistivity of the ceramic substrate at a high temperature and the crystalline carbon can suppress the decrease of the thermal conductivity of the ceramic substrate at a high temperature, so that the types of carbon may be properly selected based on the use of the substrate to be produced or the like.

The amorphous carbon can be obtained by, for example, firing a hydrocarbon composed of only C, H, and O, preferably, saccharides, in air and as the crystalline carbon, a graphite powder or the like can be used.

Further, carbon can be obtained by thermally decomposing acrylic resin in inert gas atmosphere and then heating and pressurizing the resulting acrylic resin, and by changing the acid value of the acrylic resin, the degree of the crystallinity (amorphous property) can be adjusted.

The shape of the ceramic substrate is preferably a disk-shape and the diameter is preferable to be 200 mm or more and most optimum to be 250 mm or more.

It is because the disk-shaped ceramic substrate is required to be heated evenly and the substrate having a larger diameter tends to be heated unevenly.

The thickness of the ceramic substrate is preferably 50 mm or less, more preferably 20 mm or less. The most optimum is 1 to 5 mm.

It is because if the thickness is too thin, warping easily takes place at the time of heating at a high temperature, whereas if the thickness is too thick, the thermal capacity becomes too high and therefore, the temperature-rising and -dropping properties are deteriorated.

Further, the porosity of the ceramic substrate is preferably 0 or 5% or less. The porosity is measured by Archimedes' method.

It is because the decrease of the thermal conduction at a high temperature and occurrence of warping can be suppressed.

In the present invention, based on the necessity, a thermocouple may be embedded in the ceramic substrate. It is because the temperature of the resistance heating elements can be measured by the thermocouple and on the basis of the data, the voltage and the electric current are changed to control the temperature.

The size of the bonding portion of the metal wires of the thermocouple is either same as or more than the diameter of the strands of the respective metal wires and 0.5 mm or less. With such a constitution, the thermal capacity of the bonding portion becomes small and the temperature can be precisely and quickly converted to the electric current value. Accordingly, the temperature controllability is improved and the temperature distribution in the heating face for a wafer is narrowed.

Examples of the thermocouple may include, as listed in JIS-C-1602 (1980), K-type, R-type, B-type, E-type, J-type and T-type thermocouples.

By using the thermocouple, an object to be heated such as a semiconductor wafer can be heated entirely evenly and at a prescribed temperature.

On the other hand, as described above, in the case where the resistance heating elements are formed in the ceramic substrate and the electrostatic electrodes are formed inside the ceramic substrate, the ceramic substrate functions as an electrostatic chuck.

As the metal to be employed for the electrostatic electrodes, for example, a noble metal (gold, silver, platinum, palladium), tungsten, molybdenum, nickel and the like are preferable. Further, examples of the conductive ceramic include carbides of tungsten and molybdenum. They may be used solely or in combination of two or more thereof.

Figure 4:
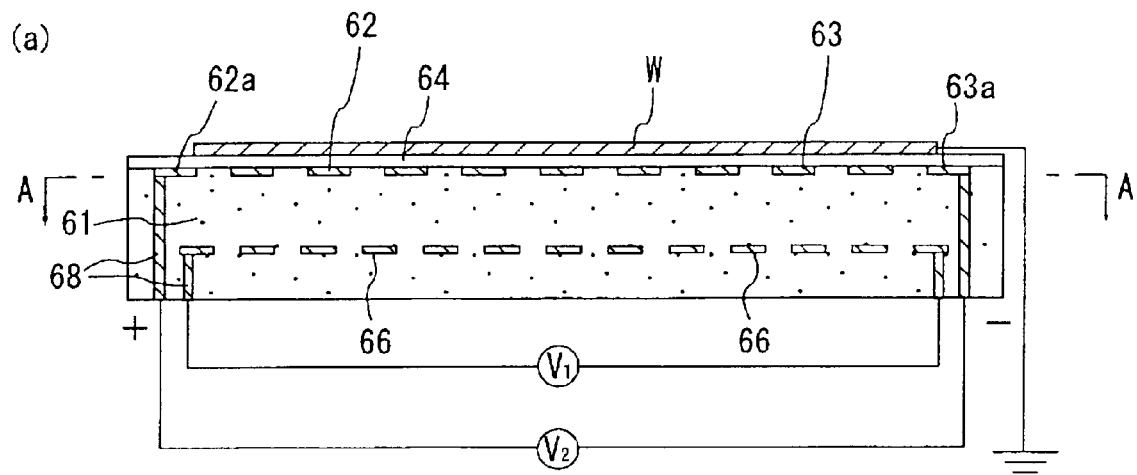
FIG. 4(a) is a vertical cross-sectional view schematically showing a ceramic substrate in the case where the substrate according to the present invention is used for an electrostatic chuck.
FIG. 4(b) is a cross-sectional view taken along line A—A of the ceramic substrate shown in FIG. 4(a).
Figure 4:
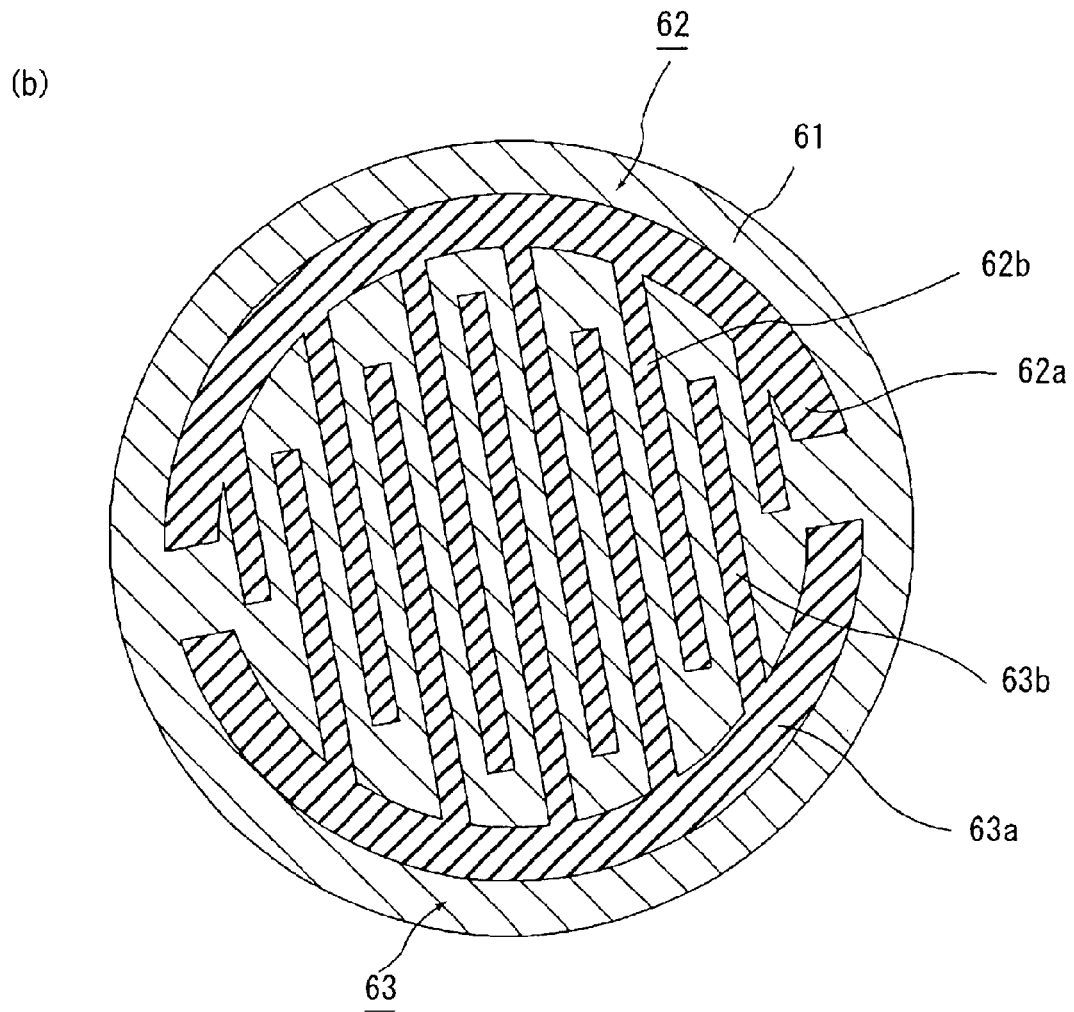

FIG. 4(a) is a vertical cross-sectional view schematically showing the ceramic substrate to be employed for the electrostatic chuck and FIG. 4(b) is a cross-sectional view along the line A—A of the ceramic substrate shown in FIG. 4(a). With respect to a ceramic substrate for an electrostatic chuck, chuck positive and negative electrostatic layers 62, 63 are embedded in the inside of a ceramic substrate 61 and connected with conductor-filled through holes 68, respectively and a ceramic dielectric film 64 is formed on these electrodes.

Further, in the inside of the ceramic substrate 61, resistance heating elements 66 and conductor-filled through holes 68 are provided so as to heat an object to be heated such as a silicon wafer W. Additionally, based on the necessity, an RF electrode is embedded in the ceramic substrate 61.

As shown in FIG. 4(b), the ceramic substrate 61 is generally formed in a circular shape when viewed in a plan and in the inside of the ceramic substrate 61, as shown in FIG. 4(b), the chuck positive electrostatic layer 62 including a semi-circular arc part 62a and combteeth-shaped parts 62b and similarly the chuck negative electrostatic layer 63 including a semi-circular arc part 63a and combteeth-shaped parts 63b are arranged on the opposite to each other so as to reciprocally arrange the combteeth-shaped parts 62b, 63b.

The ceramic substrate with such a constitution is fitted in a supporting case having approximately same structure and function as those of the supporting case 20 as shown in FIG. 1 which operates as an electrostatic chuck. In this case, a positive side and a negative side of the wiring extended from a direct current power source in a control apparatus are connected to the chuck positive electrostatic layer 62 and chuck negative electrostatic layer 63 to apply direct current voltage to both layers.

Accordingly, a silicon wafer W placed on the electrostatic chuck is electrostatically attracted and at the same time heated and under such conditions, the silicon wafer W can be subjected to various processing steps. In the present invention, since the resistance heating elements 66 are formed in the outside of the region where the silicon wafer W is placed, similarly to the case of the hot plate shown in FIG. 1, the silicon wafer W can be evenly heated.

Figure 5:
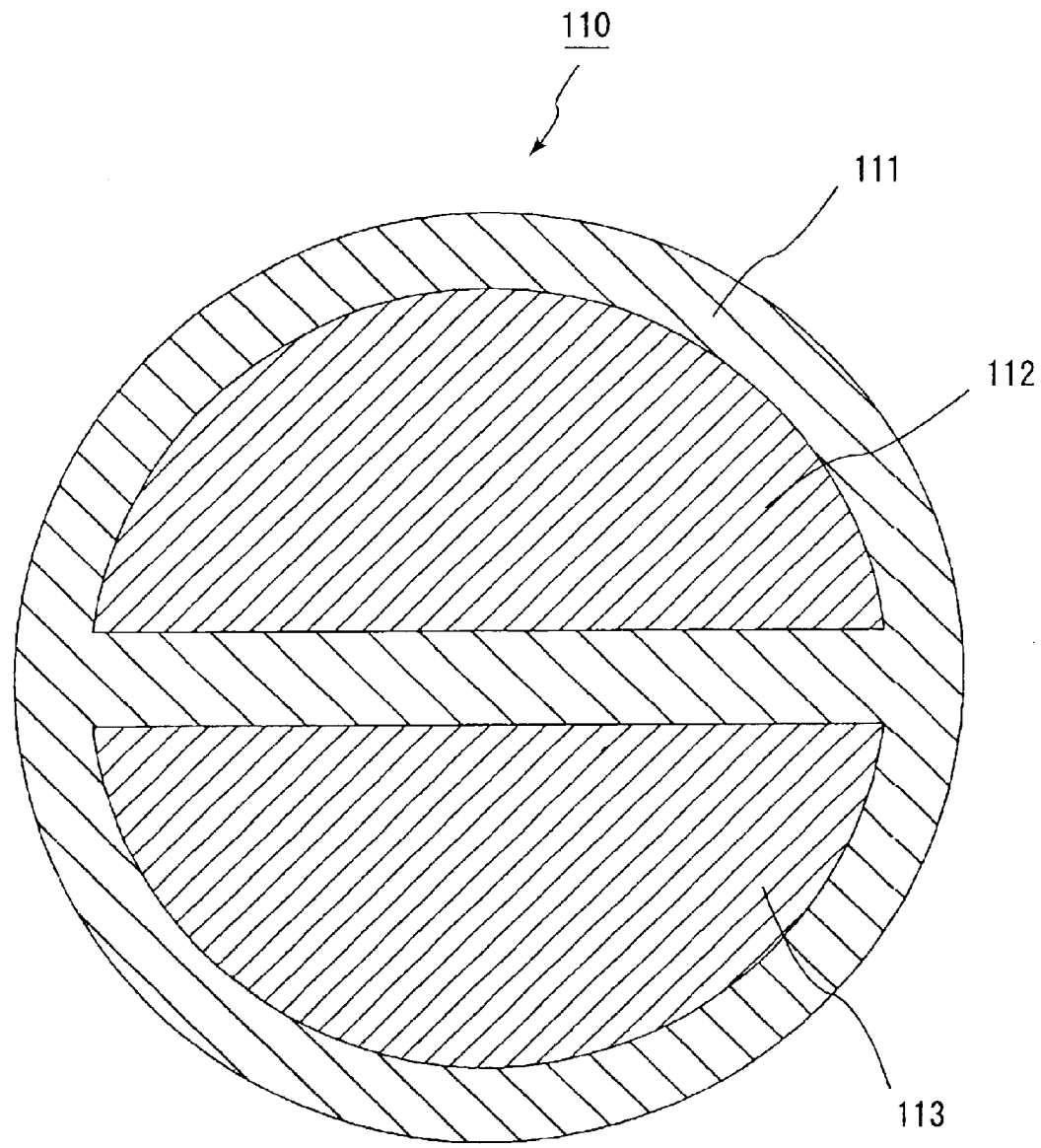
FIG. 5 is a horizontal cross-sectional view schematically showing another example of an electrostatic electrode embedded in a ceramic substrate.
Figure 6:
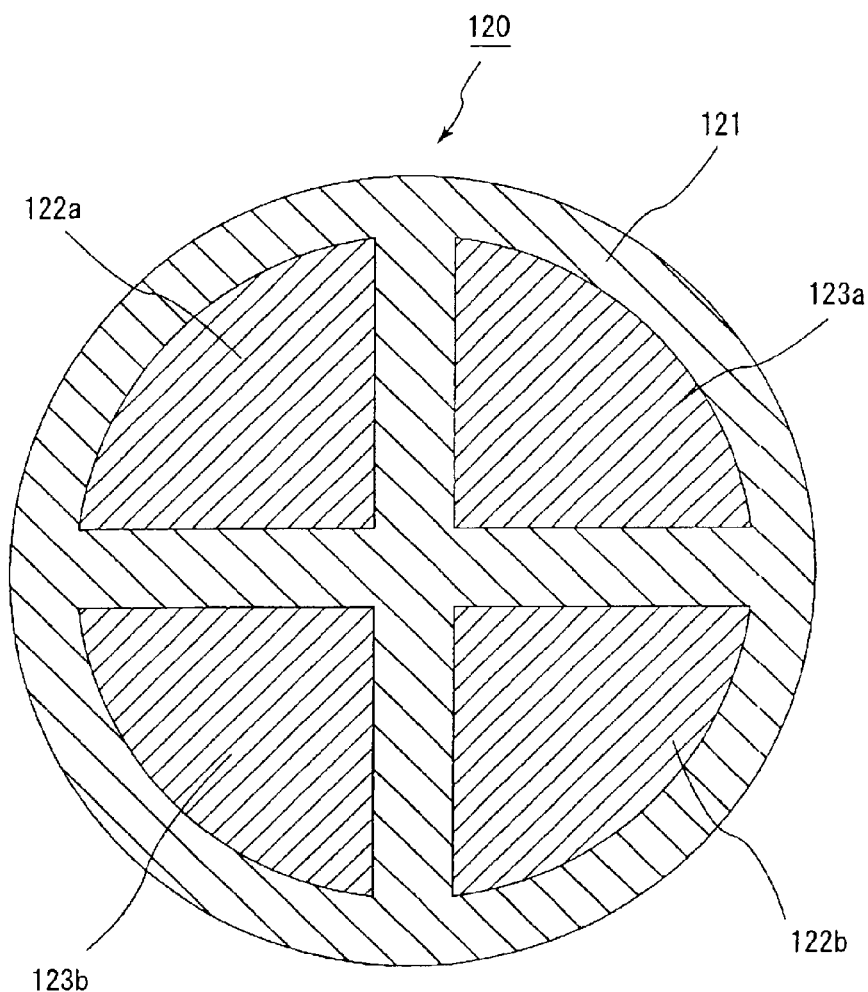
FIG. 6 is a horizontal cross-sectional view schematically showing another still example of an electrostatic electrode embedded in a ceramic substrate.

FIGS. 5 and 6 are horizontal cross-sectional views schematically showing electrostatic electrodes of ceramic substrates forming other electrostatic chucks and with respect to the ceramic substrate for the electrostatic chuck shown in FIG. 5, a semi-circular chuck positive electrostatic layer 112 and chuck negative electrostatic layer 113 are formed inside the ceramic substrate 111, with respect to the ceramic substrate for the electrostatic chuck shown in FIG. 6, chuck positive electrostatic layers 122a, 122b and chuck negative electrostatic layers 123a, 123b with a shape formed by dividing a circle into four portions are formed in the inside of the ceramic substrate 121. These two chuck positive electrostatic layers 122a, 122b and two chuck negative electrostatic layers 123a, 123b are formed so as to cross each other.

Additionally, in the case of forming electrodes with a shape formed by dividing a circle, the number of the divided portions is not particularly limited and five-divided portions or more may be formed and also, the shape is not limited to the a sector.

Further, as described above, a chuck top conductor layer is formed on the surface of the ceramic substrate and guard electrodes or ground electrodes are formed as the inner conductor layers, the resulting ceramic substrate functions as a wafer prober.

Figure 7:
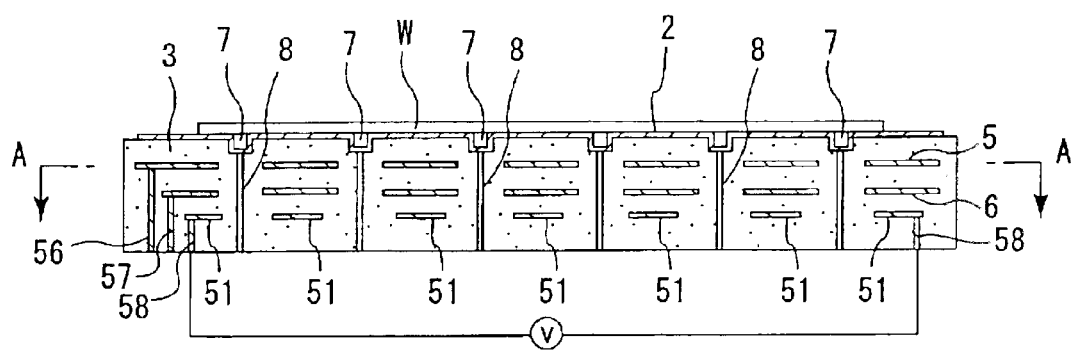
FIG. 7 is a cross-sectional view schematically showing a ceramic substrate in the case where the ceramic substrate according to the present invention is used for a wafer prober.
Figure 8:
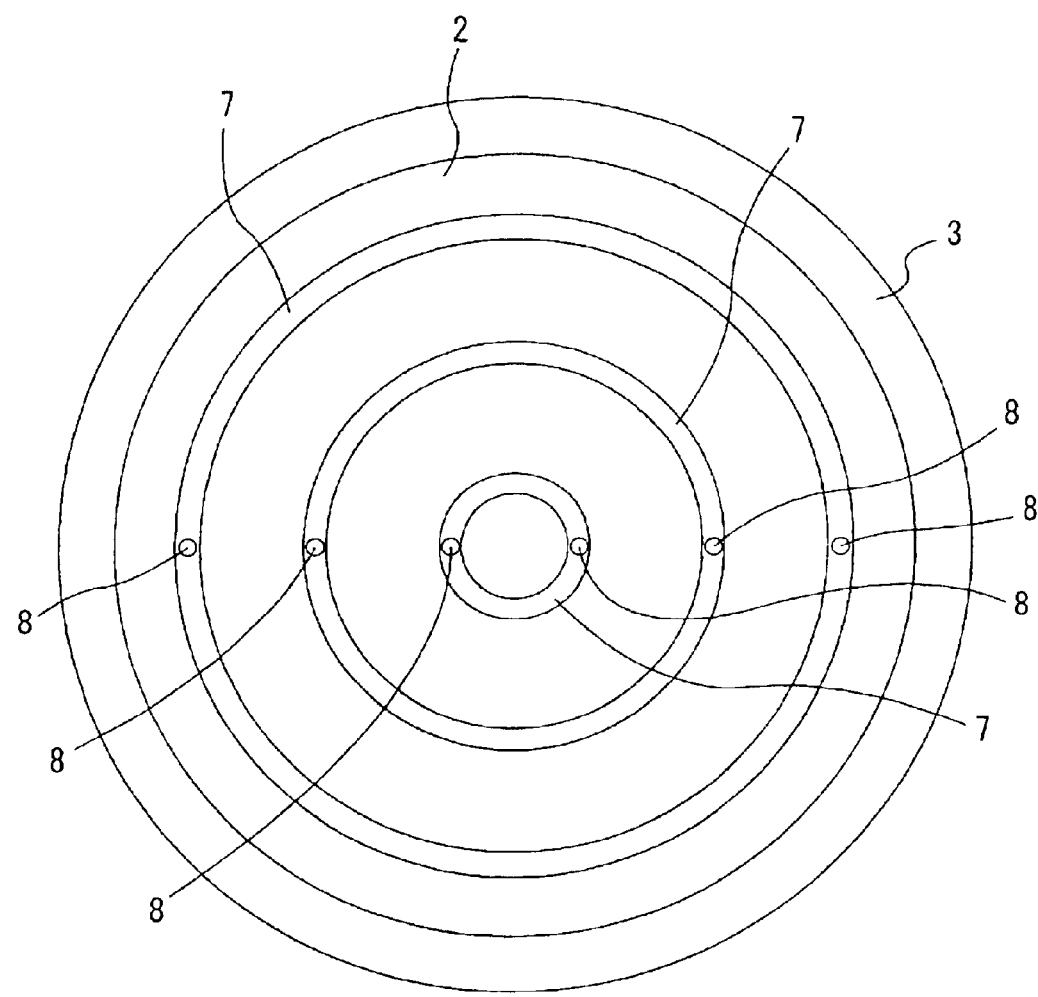
FIG. 8 is a plan view of the ceramic substrate shown in FIG. 7.

FIG. 7 is a cross-sectional view schematically showing one embodiment of a ceramic substrate forming a wafer prober of the present invention. FIG. 8 is its plan view thereof and FIG. 9 is a cross-sectional view taken along line A—A in the wafer prober shown in FIG. 7.

With respect to the wafer prober, concentric circular grooves 7 are formed in the surface of a ceramic substrate 3 with a circular shape when viewed in a plan, a plurality of suction holes 8 for sucking a silicon wafer are formed in some portions of the grooves 7, and a chuck top conductor layer 2 is circularly formed in almost all over the ceramic substrate 3 including the grooves 7 to be connected with an electrode of the silicon wafer.

On the other hand, in the inside of the ceramic substrate 3, resistance heating elements 51 with concentrically circular shapes when viewed in a plan are provided in order to control the temperature of a silicon wafer. Both ends of each resistance heating element 51 are connected to and fixed in external terminals (not shown) via conductor-filled through holes 58 and blind holes (not shown) which expose the conductor-filled through holes.

Figure 9:
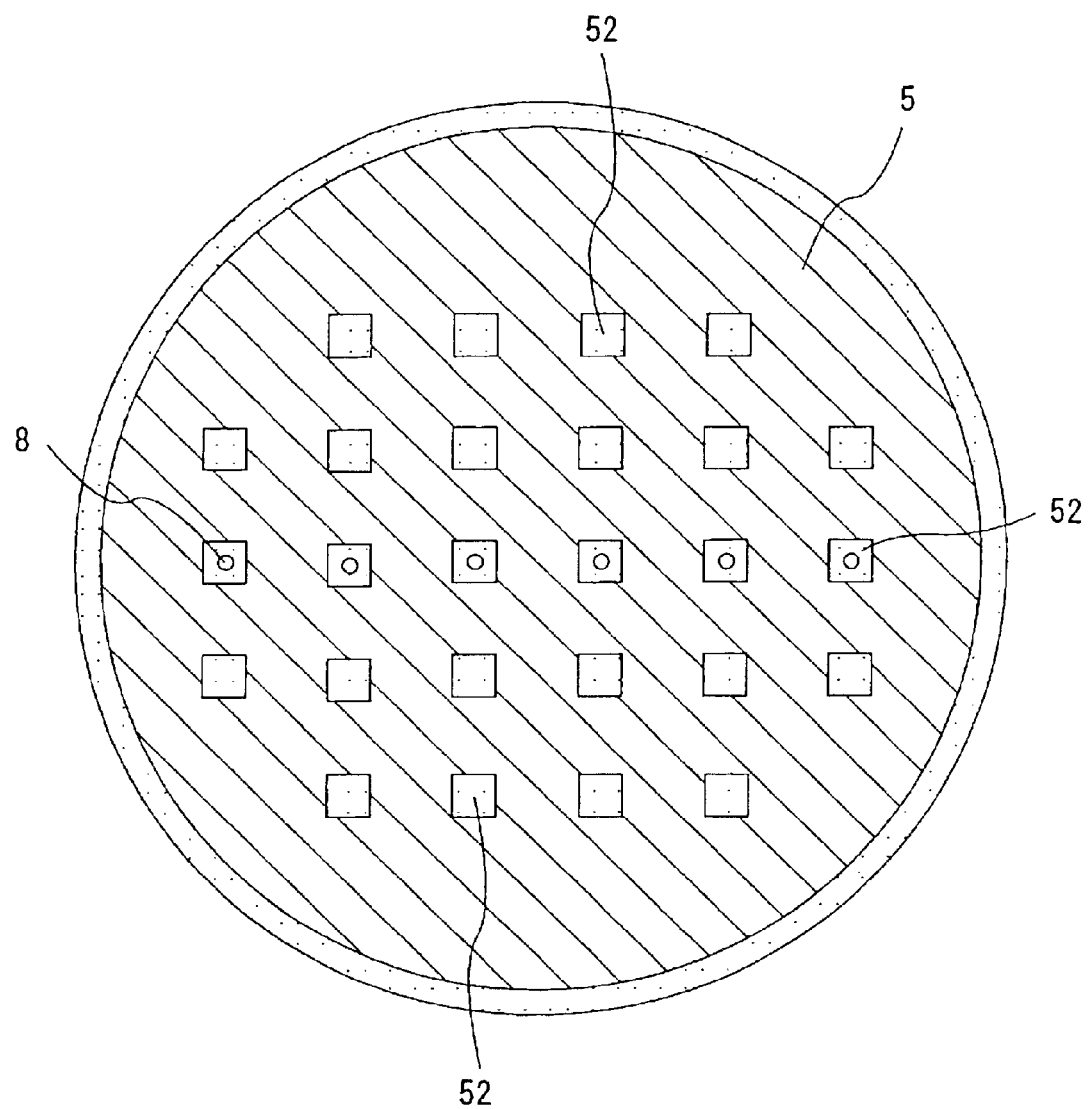
FIG. 9 is a cross-sectional view taken along line A—A of the ceramic substrate shown in FIG. 7.

Further, in the ceramic substrate 3, lattice-shaped guard electrodes 5 and ground electrodes 6 as shown in FIG. 9 are provided and these guard electrodes 5 and ground electrodes 6 are connected to external terminals, which are not shown, via conductor-filled through holes 56, 57. Incidentally, the numeric character 52 denotes non electrode formed areas. The reason why such rectangular non electrode formed areas 52 are formed in the inside of the guard electrodes 5 is because an upper and a lower ceramic substrates 3 sandwiching the guard electrodes 5 have to be firmly bonded to each other.

The ceramic substrate with such a constitution is fitted in a supporting case with a similar structure to that shown in FIG. 1 and operates as a wafer prober.

With respect to the wafer prober, after a silicon wafer bearing integrated circuits is placed on the ceramic substrate 3, a probe card having tester pins is pushed against the silicon wafer and an electric communication test can be carried out by applying voltage in heating or cooling condition.

With respect to the wafer prober of the present invention, since the resistance heating elements 51 are also formed outside the region (not shown) where the silicon wafer is placed, similar to the hot plate shown in FIG. 1, the silicon wafer W can be evenly heated.

Next, hereinafter, a production method of a hot plate will be described as one example of a production method of a semiconductor producing/examining device according to the present invention.

Figure 10:
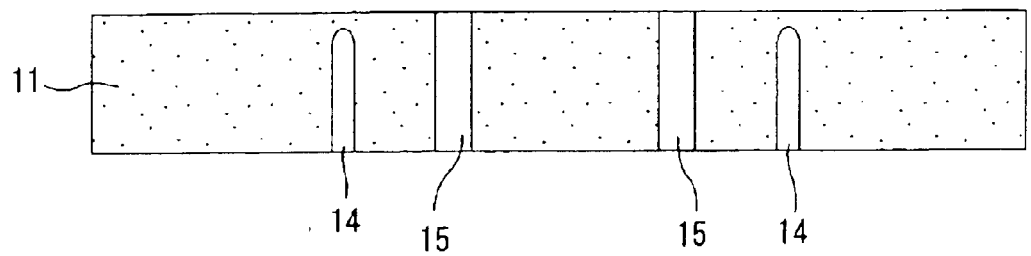
Figure 10:
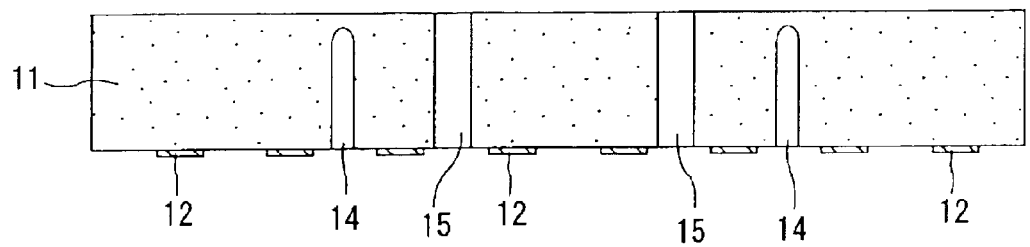
Figure 10:
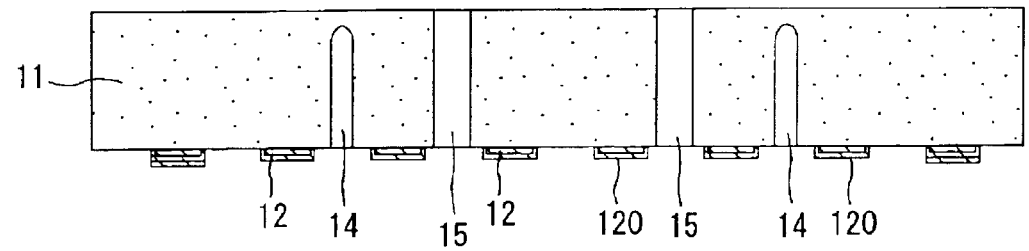
Figure 10:
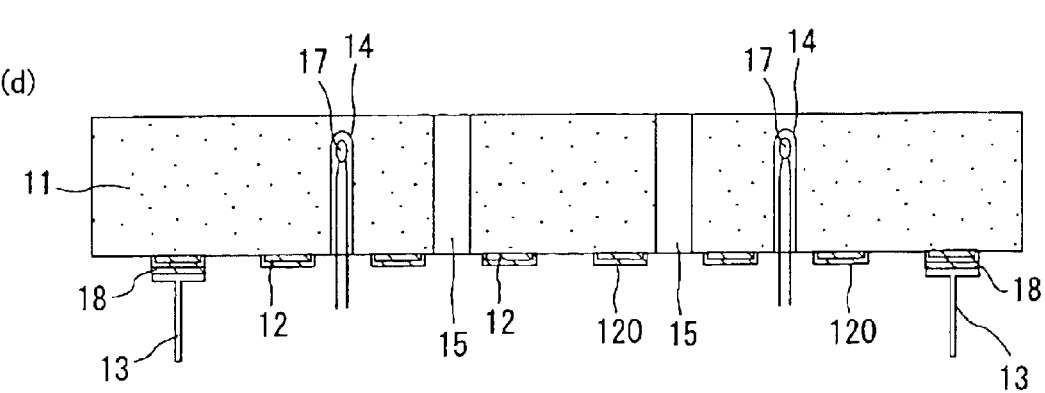

At first, along with FIG. 10, a production method of a hot plate using a ceramic substrate comprising resistance heating elements 12 in the bottom face thereof will be described.

(1) Step of Producing Ceramic Substrate

After a slurry is prepared by adding yttria or the like as a sintering aid, a binder, and the like based on necessity to a nitride ceramic of such as aluminum nitride, the slurry is granulated by a method such as spray drying and the obtained granule is put in a die and pressurized to form a plate-shaped green sheet or the like. At that time, carbon may be added.

Next, in the green sheet, based on the necessity, the following portions are formed: portions to be through holes 15 to let lifter pins for transporting a silicon wafer pass through; portions to be bottomed holes 14 to embed temperature measuring elements such as thermocouples therein; and portions to be through holes and concave portions to insert supporting pins for supporting a silicon wafer into. The bottomed holes 14 and the through holes 15 may be formed in a produced ceramic substrate using a drill or the like after firing.

Next, green sheets produced in such a manner are sintered by heating and firing to produce a plate-shaped body made of a ceramic. After that the plate-shaped body is processed to be in a prescribed shape to produce a ceramic substrate 11 or the green sheets may be formed so as to use the shape as it is after firing. By carrying out heating and firing while applying pressure, a ceramic substrate 11 free from voids can be produced. The heating and firing may be carried out at a sintering temperature or more, and generally it is 1000 to 2500° C. in the case of a nitride ceramic. In general, the through holes 15 and bottomed holes 14 are formed after firing (FIG. 10(*a*)).

(2) Step of Printing Conductor Containing Paste on Ceramic Substrate

A conductor containing paste is generally a fluid with a high viscosity containing a metal particle, resin and a solvent. The conductor containing paste is printed on portions where the resistance heating elements are to be provided by screen printing or so to form a conductor containing paste layer. Further, since it is required to keep the entire body of the ceramic substrate at an even temperature, the resistance heating elements are preferably printed in patterns of concentric circular shapes and winding lines in combination.

The conductor containing paste layer is preferably formed in order that the resistance heating elements 12 after firing has rectangular and flat cross-sectional shape.

(3) Firing of Conductor Containing Paste

The conductor containing paste layer printed on the bottom face of the ceramic substrate 11 is heated and fired to remove the resin, the solvent and the like and at the same time to sinter the metal particles and bake them on the bottom face of the ceramic substrate 11 to form the resistance heating elements 12 (FIG. 10(b)). The heating and firing temperature is preferably 500 to 1000° C.

If the above-mentioned metal oxide is added to the conductor containing paste, the metal particles, the ceramic substrate, and the metal oxide are united by sintering, so that the adhesion strength of the resistance heating elements and the ceramic substrate can be improved.

(4) Forming Metal Covering Layer

A metal covering layer 120 is provided on the surface of the resistance heating elements 12 (FIG. 10(c)).

The metal covering layer 120 can be formed by electroplating, electroless plating, sputtering and the like, however, taking the mass productivity into consideration, electroless plating is the optimum means.

(5) Attaching Terminal and the Like

External terminals 13 for connecting to an electric power source are attached to the end parts of the patterns of the resistance heating elements 12 through solder layers 18. Further, temperature measuring elements 17 such as thermocouples are inserted into the bottomed holes 14 and sealed with a heat resistant resin such as polyimide or the like, a ceramic, and so forth (FIG. 10(d)).

(6) Installation of Ceramic Substrate on Supporting Case

Next, after the ceramic substrate 11 is fitted into a heat insulating ring 21 of a supporting case 20, the ceramic substrate 11 is fixed to the heat insulating ring 21 using bolts 28, fixing tools 27 and the like and conductive wires 24 and lead wires 16 are led out of the bottom face of a heat shielding member 22 to complete the production of a hot plate 10 with a structure shown in FIG. 1.

At the time of producing the hot plate, by providing electrostatic electrodes inside the ceramic substrate, an electrostatic chuck can be produced. Also, by providing a chuck top conductor layer on a heating face and guard electrodes and ground electrodes inside the ceramic substrate, a wafer prober can be produced.

In the case of providing electrodes inside the ceramic substrate, a metal foil or the like may be embedded inside the ceramic substrate. Also, in the case of forming a conductor layer on the surface of the ceramic substrate, a sputtering method and a plating method may be employed and they may be employed in combination.

Figure 11:
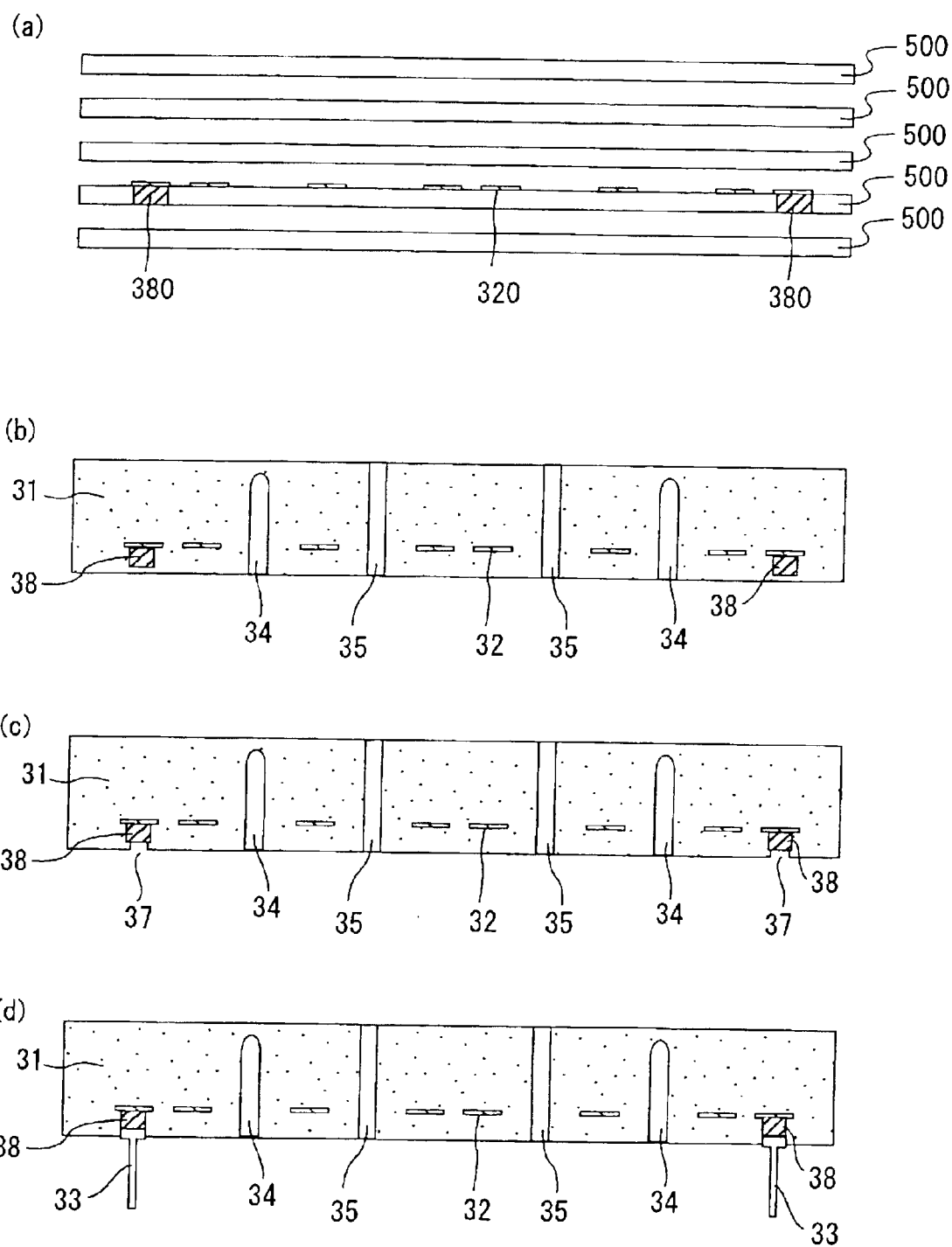

Next, a production method of a hot plate comprising resistance heating elements inside a ceramic substrate will be described with reference to FIG. 11.

(1) Step of Producing Ceramic Substrate

At first, a paste is prepared by mixing a binder, a solvent and the like with a powder of a nitride ceramic, and then green sheets are produced using the prepared paste.

As the above-mentioned ceramic powder, aluminum nitride and the like can be used and based on the necessity, a sintering aid of such as yttria or the like may be added.

As the binder, at least one selected from acrylic binders, ethyl cellulose, butyl cellosolve, and polyvinyl alcohol is preferable.

Also, as the solvent, at least one selected from α-terpineols and glycols is preferable.

A paste obtained by mixing them is formed in sheet-shape by a doctor blade method to produce green sheets 500.

The thickness of each green sheet 500 is preferably 0.1 to 5 mm.

Next, based on the necessity, the following portions are formed: portions to be through holes 35 to let lifter pins for transporting a silicon wafer pass through; portions to be bottomed holes 34 to embed temperature measuring elements such as thermocouples therein; portions to be through holes to insert supporting pins for supporting a silicon wafer into; and portions 380 to be conductor-filled through holes for connecting resistance heating elements with external terminals in the outside. The above-mentioned processing may be carried out after a green sheet lamination body is formed, which will be described later, or after the above-mentioned lamination body is formed and fired.

(2) Step of Printing Conductor Containing Paste on the Green Sheet

A metal paste or a conductor containing paste containing a conductive ceramic is printed on a green sheet to form a conductor containing paste layer.

These conductor containing pastes contain metal particles or conductive ceramic particles.

The average particle size of tungsten particles or molybdenum particles is preferably 0.1 to 5 μm. It is because if the average particle size is less than 0.1 μm or exceeds 5 μm, the conductor containing paste becomes difficult to be printed.

Examples of the conductor containing paste includes a composition (a paste) containing 85 to 87 parts by weight of metal particles or conductive ceramic particles; 1.5 to 10 parts by weight of at least one binder selected from acrylic type ones, ethyl cellulose, butyl cellosolve, and polyvinyl alcohol; and 1.5 to 10 parts by weight of at least one solvent selected from α-terpineols and glycols.

(3) Step of Laminating Green Sheet

Green sheets 500 on which no conductor containing paste is printed are laminated in the upper side and the lower side of the green sheet on which the conductor containing paste is printed (FIG. 11(a)).

In this case, the number of the green sheets 500 laminated in the upper side is made larger than the number of the green sheets 500 laminated in the lower side to place the resistance heating element formation position unevenly closer to the bottom face side.

Practically, the number of the layers of the green sheets 500 in the upper side is preferably 20 to 50 and the number of the layers of the green sheet 500 in the lower side is preferably 5 to 20.

(4) Step of Firing Green Sheet Lamination Body

The green sheet lamination body is heated and pressurized to sinter the ceramic particles in the green sheets and the metal in the inner conductor containing paste layer (FIG. 11(b)).

The heating temperature is preferably 1000 to 2000° C. and the pressurizing pressure is preferably 10 to 20 MPa. Heating is carried out in inert gas atmosphere. As the inert gas, for example, argon, nitrogen and the like can be used.

As described above, after firing, through holes for letting lifter pins pass through and bottomed holes (not shown) for inserting temperature measuring elements into may be provided. The through holes and the bottomed holes may be formed by drilling process and blast treatment by sand blast after surface polishing. Further, blind holes 37 for exposing conductor-filled through holes 38 for the connection to the resistance heating elements 32 in the inside are formed (FIG. 11(c)), and external terminals 33 are inserted into the blind holes 37. Then, they are heated to carry out reflow and to connect the external terminals 33 (FIG. 11(d)) thereto. The heating temperature is preferably 90 to 450° C. in the case of a solder and 900 to 1100° C. in the case of a blazing material.

Further, thermocouples as temperature measuring elements are sealed by heat resistant resin or the like. After that, the resulting ceramic substrate is fitted in a heat insulating ring 21 of a supporting case 20 and then the ceramic substrate is fixed to the heat insulating ring 21 using bolts 28 and fixing metal tools 27 and conductive wires and lead wires are led out of the bottom face of a heat shielding member 22 to complete the production of a hot plate.

With the hot plate, after a silicon wafer is placed thereon or a silicon wafer is supported by supporting pins, while being heated or cooled, the silicon wafer can be subjected to a variety of processing steps.

At the time of producing the above-mentioned hot plate, an electrostatic chuck can be produced by providing electrostatic electrodes inside the ceramic substrate and also a wafer prober can be produced by providing guard electrodes or ground electrodes inside the ceramic substrate.

In the case where electrodes are formed in the inside of the ceramic substrate, similarly to the case of forming the resistance heating elements, a conductor containing paste layer may be formed on the surface of a green sheet. Also, in the case a conductor layer is formed on the surface of the ceramic substrate, a sputtering method or a plating method may be employed and these methods may be employed in combination.

Hereinafter, the present invention will be described more in details.

BEST MODES FOR CARRYING OUT THE INVENTION

EXAMPLE 1

Production of Hot Plate (see FIG. 1 and FIGS. 10(a) to 10(d))

(1) A composition containing 100 parts by weight of aluminum nitride powder (manufactured by Tokuyama Corporation, average particle size of 1.1 $\mu$m), 4 parts by weight of yttrium oxide ($Y_2O_3$: yttria, average particle size of 0.4 $\mu$m), and 12 parts by weight of an acrylic resin-based binder and alcohol was spray dried to obtain a granular powder.

(2) Next, after the granular powder was put in a die and formed in sheet-shape to obtain green sheets.

(3) Each green sheet finished through the processing steps was hot pressed at a temperature of 1800° C. and a pressure of 20 MPa to obtain an aluminum nitride sintered body with a thickness "1" of 3 mm.

Next, a disk body with a diameter of 310 mm was cut out of the plate-shaped body (a ceramic substrate 11).

Next, plate-like body was subjected to drilling process to form through holes 15 for letting lifter pins pass through for transporting a semiconductor wafer and bottomed holes 14 (diameter: 1.1 mm, depth: 2 mm) for embedding thermocouples therein (FIG. 10(a)).

(4) A conductor containing paste was printed on the bottom face of the sintered body obtained in the step (3) by screen printing. The printed patterns were concentrically circular patterns as shown in FIG. 2.

As the conductor containing paste, Solbest PS603D manufactured by Tokuriki Chemical Research Co., Ltd. used for plated through hole formation in a printed circuit board was used.

The conductor containing paste was a silver-lead paste and contained 7.5 parts by weight of metal oxides containing lead oxide (5% by weight), zinc oxide (55% by weight), silica (10% by weight), boron oxide (25% by weight), and alumina (5% by weight) additionally to 100 parts by weight of silver. The silver particle had an average particle size of 4.5 $\mu$m and scaly shape.

(5) Next, the sintered body on which the conductor containing paste was printed was heated and fired at 780° C. to sinter the silver and lead in the conductor containing paste and bake them on the sintered body to form resistance heating elements 12 (FIG. 10(b)). The silver-lead resistance heating elements 12 had a thickness of 5 $\mu$m, a width of 2.4 mm, and the area resistivity of 7.7 m$\Omega$/□ in the vicinity of the end portions thereof.

(6) Next, a sintered body produced by the above-mentioned step (5) was immersed in an electroless nickel plating bath of an aqueous solution containing 80 g/L of nickel sulfate, 24 g/L of sodium hypophosphite, 12 g/L of sodium acetate, 8 g/L of boric acid, and 6 g/L of ammonium chloride to deposit a metal covering layer 120 (a nickel layer) with a thickness of 1 $\mu$m on the surface of the silver-lead resistance heating elements 12 (FIG. 10(c)).

(7) A solder layer 18 was formed by printing a silver-lead solder paste (manufactured by Tanaka Kikinzoku Kogyo K.K.) by screen printing on the end portions 12a for assuring the connection with an electric power source.

Next, external terminals 13 with a T-shaped cross-sectional shape were attached to the end portions 12a of the resistance heating elements by placing the external terminals 13 on the solder layer 18 and carrying out reflow of the solder at 420° C.

(8) For temperature control, thermocouples were inserted into the bottomed holes and polyimide resin was filled in the bottomed holes and cured at 190° C. for 2 hours to obtain the ceramic substrate 11 having the resistance heating elements 12 in the bottom face 11b.

(9) Next, the ceramic substrate 11 was fitted into a heat insulating ring 21 of a supporting case 20, then the ceramic substrate 11 was fixed in the heat insulating ring 21 using bolts 28, fixing tools 27 and the like and conductive wires 24 and lead wires 16 were led out of the bottom face of a heat shielding member 22 to complete the production of a hot plate 10.

The diameter of the outermost circumference of the resistance heating elements 12 formed in this example was 306 mm and the diameter of a silicon wafer to be placed was 300 mm and the region where the silicon wafer would be placed existed in the inside of the region where the resistance heating elements 12 were formed.

Incidentally, in this example, "1"=3 mm, "L"=3 mm, 1/20=0.15 mm.

EXAMPLE 2

Production of Electrostatic Chuck (1) Green sheets with a thickness of 0.47 mm were obtained by forming a composition obtained by mixing 100 parts by weight of an aluminum nitride powder (manufactured by Tokuyama Corporation, average particle size of 1.1 μm), 4 parts by weight of yttria (average particle size of 0.4 μm), 12 parts by weight of an acrylic resin-based binder, 0.5 parts by weight of a dispersant, and 53 parts by weight of alcohol containing 1-butanol and ethanol by a doctor blade method.

(2) Next, after the green sheets were dried at 80° C. for 5 hours, a green sheet was punched to form through holes for formation of conductor-filled through holes for connecting resistance heating elements and external terminals.

(3) A conductor containing paste A was produced by mixing 100 parts by weight of a tungsten carbide particle with an average particle size of 1 μm, 3.0 parts by weight of an acrylic binder, 3.5 parts by weight of α-terpineol solvent, and 0.3 parts by weight of a dispersant. Also, a conductor containing paste B was produced by mixing 100 parts by weight of a tungsten particle with an average particle size of 3 μm, 1.9 parts by weight of an acrylic binder, 3.7 parts by weight of a-terpineol solvent, and 0.2 parts by weight of a dispersant.

(4) The conductor containing paste A was printed on the surface of the green sheet to form resistance heating elements. The printed patterns were made to be similar patterns composed of concentrically circular parts and winding line parts in combination to those of Example 1. Further, a conductor containing paste layer in electrostatic electrode patterns with the shape as shown in FIG. 4(b) was formed on another green sheet.

Further, the through holes for formation of conductor-filled through holes for connecting the external terminals were filled with the conductor containing paste B. The electrostatic electrode patterns were including combteeth-shaped electrodes (62b, 63b), and 62b, 63b were to be connected with 62a, 63a, respectively (see FIG. 4(b)).

Further, 34 sheets of green sheets and 13 sheets of green sheets on which no tungsten paste was printed were laminated on the top side (the heating face side) and on the down side (the bottom face side), respectively, of the green sheet finished for the above-mentioned processing and further thereon, a green sheet on which a conductor containing paste layer in electrostatic electrode patterns was laminated and furthermore, two sheets of green sheets on which no tungsten paste was printed was laminated and the resulting lamination body was press-bonded at 130° C. in 8 MPa pressure to obtain a lamination body.

(5) Next, the obtained lamination body was degreased at 600° C. for 5 hours in nitrogen gas and after that, hot pressed in conditions of 1890° C. for 3 hours in 15 MPa pressure to obtain an aluminum nitride plate body with a thickness "1" of 3 mm. The plate body was cut into a disk-shape with a diameter of 219 mm to obtain a plate body made of aluminum nitride and comprising resistance heating elements 32 with a thickness of 5 μm, a width of 2.4 mm, and the area resistivity of 7.7 mΩ/□ and a chuck positive electrostatic layer 62 and a chuck negative electrostatic layer 63 with a thickness of 6 μm.

(6) Next, after the ceramic substrate 61 obtained in the above-mentioned step (5) was ground by a diamond grindstone, a mask was placed thereon and bottomed holes (diameter: 1.2 mm, depth: 2.0 mm) were provided in the surface for thermocouples by blast treatment using SiC or the like.

(7) Further, portions where the conductor-filled through holes were formed were hollowed out to form blind holes and a gold blazing material comprising Ni—Au was used for the blind holes and heated at 700° C. for reflow and external terminals made of kovar were attached to the blind holes and after that, sockets having conductive wires were connected to the external terminals.

(8) Next, a plurality of thermocouples for controlling temperature were embedded in the bottomed holes to complete production of the ceramic substrate 61 comprising the resistance heating elements and electrostatic electrodes 62, 63.

(9) Next, the ceramic substrate 61 is fitted into and fixed in the supporting case, thereby completing the production of the electrostatic chuck.

The diameter of the outermost circumference of the resistance heating elements 66 formed in this example was 215 mm and the diameter of a silicon wafer to be placed was 200 mm and the region where the silicon wafer is placed existed inside the region where the resistance heating elements 12 were formed.

It is noted that, in this example, "1"=3 mm, "L"=7.5 mm, "1"/20 =0.15 mm.

EXAMPLE 3

Production of Wafer Prober (1) Green sheets with a thickness of 0.47 mm were obtained by forming a composition obtained by mixing 100 parts by weight of an aluminum nitride powder (manufactured by Tokuyama Corporation, average particle size of 1.1 μm), 4 parts by weight of yttria (average particle size of 0.4 μm), 12 parts by weight of an acrylic resin-based binder, 0.5 parts by weight of a dispersant, and 53 parts by weight of alcohol containing 1-butanol and ethanol by a doctor blade method.

(2) Next, after the green sheets were dried at 80° C. for 5 hours, a green sheet was punched to form through holes for formation of conductor-filled through holes for connecting electrodes and external terminals.

(3) A conductor containing paste A was prepared by mixing 100 parts by weight of a tungsten carbide particle with an average particle size of 1 μm, 3.0 parts by weight of an acrylic binder, 3.5 parts by weight of α-terpineol solvent, and 0.3 parts by weight of a dispersant. Also, a conductor containing paste B was prepared by mixing 100 parts by weight of a tungsten particle with an average particle size of 3 μm, 1.9 parts by weight of an acrylic binder, 3.7 parts by weight of α-terpineol solvent, and 0.2 parts by weight of a dispersant.

(4) The above-mentioned conductor containing paste A was printed on the surface of the green sheet to form a printed layer for lattice like guard electrodes and a printed layer for lattice-shaped ground electrodes (see FIG. 9).

Further, the above-mentioned through holes for formation of conductor-filled through holes for connecting the external terminals were filled with the conductor containing paste B to form filled layers for the conductor-filled through holes.

Then, the green sheet on which the conductor containing paste was printed and 50 sheets of green sheets on which no conductor containing paste was printed were laminated and integrated at 130° C. by pressure of 8 MPa.

(5) Next, the integrated lamination was degreased at 600° C. for 5 hours and after that, hot pressed in conditions of 1890° C. for 3 hours in 15 MPa pressure to obtain an aluminum nitride plate body with a thickness "1" of 3 mm. The plate body was cut into a disk-shape with a diameter of 205 mm to obtain a ceramic substrate. The size of the conductor-filled through holes was 0.2 mm in diameter and 0.2 mm in depth. The thickness of the guard electrodes and the ground electrodes was 10 μm and the formation positions of the guard electrodes in the thickness direction of the sintered body was 1 mm from the chuck face, whereas the formation positions of the ground electrodes in the thickness direction of the sintered body was 1.2 mm from the resistance heating element.

(6) Next, after the ceramic substrate obtained in the above-mentioned step (5) was ground by a diamond grindstone, a mask was placed thereon and bottomed holes for attaching thermocouples and grooves (width: 0.5 mm; depth: 0.5 mm) for sucking a wafer were formed in the surface by blast treatment using SiC or the like.

(7) Further, a conductor containing paste was printed on the rear face (the bottom face) which is on the opposite to the chuck face having the grooves to form a conductor containing paste layer for resistance heating elements. As the conductor containing paste, Solbest PS603D manufactured by Tokuriki Chemical Research Co., Ltd. used for plated through hole formation in a printed circuit board was used. That is, the conductor containing paste was a silver/lead paste and contained 7.5% by weight of metal oxides containing lead oxide, zinc oxide, silica, boron oxide, and alumina (the weight ratio thereof was 5/55/10/25/5) in silver.

The silver particle had an average particle size of 4.5 μm and scaly shape.

(8) The ceramic substrate on which circuits were formed by printing the conductor containing paste on the bottom face was heated and fired at 780° C. to sinter the silver and lead in the conductor containing paste and bake them on the sintered body to form resistance heating elements. The patterns of the resistance heating elements were made to be similar patterns including concentrically circular parts and winding line parts in combination to those of Example 1. Next, the obtained ceramic substrate was immersed in an electroless nickel plating bath of an aqueous solution containing 30 g/L of nickel sulfate, 30 g/L of boric acid, 30 g/L of ammonium chloride, and 60 g/L of Rochelle salt to further deposit a nickel layer containing boron in a content of 1% by weight or less and having a thickness of 1 μm on the surface of the resistance heating elements comprising the above-mentioned conductor containing paste to thicken the resistance heating elements and after that the resulting substrate was subjected to heating treatment at 120° C. for 3 hours.

The resistance heating elements including the nickel layer and obtained in such a manner had a thickness of 5 μm, a width of 2.4 mm, and the area resistivity of 7.7 mΩ/□.

(9) The chuck face in which the grooves were formed was coated successively with the layers of Ti, Mo and Ni by sputtering method. The sputtering was carried out using SV-4540 manufactured by ULVAC Japan Co. as an apparatus in conditions of 0.6 Pa pressure, 100° C. temperature, 200 W power, and 30 seconds to 1 minute treating period. The sputtering period was adjusted depending on the respective metals to be sputtered.

The formed film was found contained 0.3 μm of Ti, 2 μm of Mo, and 1 μm of Ni from an image by a fluorescent x-ray spectrometer.

(10) The ceramic substrate obtained by the above-mentioned step (9) was immersed in an electroless nickel plating bath of an aqueous solution containing 30 g/L of nickel sulfate, 30 g/L of boric acid, 30 g/L of ammonium chloride, and 60 g/L of Rochelle salt to deposit a nickel layer (thickness of 7 μm) containing boron in a content of 1% by weight or less on the surface of the grooves 7 formed in the chuck face and the resulting substrate was subjected to heating treatment at 120° C. for 3 hours.

Further, the ceramic substrate was immersed in an electroless gold plating solution containing 2 g/L of potassium cyanoaurate, 75 g/L of ammonium chloride, 50 g/L of sodium citrate, and 10 g/L of sodium hypophosphite at 93° C. for 1 minute to further form a 1 μm-thick gold plating layer on the nickel plating layer in the chuck face side of the ceramic substrate.

(11) Next, air suction holes piercing from the grooves to the rear face were formed by drilling process and blind holes for exposing the conductor-filled through holes were also formed. Using gold blazing material made of a Ni—Au alloy (81.5% by weight of Au, 18.4% by weight of Ni, and 0.1% by weight of impurities), external terminals made of kovar were connected to the blind holes by heating at 970° C. for reflow. Further, external terminals made of kovar were formed in the resistance heating elements through a solder alloy (tin 9/lead 1). After that, sockets having conductive wires were attached to the external terminals.

(12) For temperature control, a plurality of thermocouples were embedded (not shown) in the bottomed holes to complete production of the ceramic substrate comprising the chuck top conductor layer 2 in the surface, the guard electrodes 5 and ground electrodes 6 in the inside, and resistance heating elements in the bottom face.

(13) After that, the ceramic substrate was fitted and fixed in a supporting case to complete the production of the electrostatic chuck.

The diameter of the outermost circumference of the resistance heating elements 66 formed in this example was 203 mm and the diameter of a silicon wafer to be placed was 200 mm and the region where the silicon wafer is placed existed inside the region where the resistance heating elements 12 were formed.

It is noted that, in this Example, "1"=3 mm, "L"=1.5 mm, "1"/20=0.15 mm.

EXAMPLE 4

This Example was same as Example 1, except that the diameter of the outermost circumference of the resistance heating elements was adjusted to be 203 mm, the diameter of a silicon wafer was 200 mm, and the thickness "1" of the ceramic substrate was adjusted to be 32 mm. It is noted that, in the example, "1"=32 mm, "L"=1.5 mm, "1"/20=1.6 mm.

EXAMPLE 5

This Example was same as Example 1, except that the diameter of the outermost circumference of the resistance heating elements was adjusted to be 200.5 mm, the diameter of a silicon wafer was 200 mm, and the thickness "1" of the ceramic substrate was adjusted to be 3 mm. It is noted that, in the example, "1"=3 mm, "L"=0.25 mm, "1"/20=0.15 mm.

COMPARATIVE EXAMPLE 1

A hot plate was produced in the same manner as Example 1, except that the diameter of the outermost circumference of the resistance heating elements was set to be 290 mm, which is smaller than the diameter, 300 mm, of a silicon wafer to be placed on the heating face.

Electric power was applied to the ceramic substrates of the Examples 1 to 5 and Comparative Example 1 to heat the ceramic substrates to 200° C. and the temperature distribution of the heating face of each ceramic substrate was measured using a thermo-viewer (IR 62012-0012 manufactured by Nippon Datum Co.).

As a result, the difference between the highest temperature and the lowest temperature was as narrow as 0.5° C. in the case of Example 1; 0.8° C. in the case of Example 2; 0.5° C. in the case of Example 3; 1.0° C. in the case of Example 4; and 1.0° C. in the case of Example 5, whereas the difference between the highest temperature and the lowest temperature in the comparative example was 5.0° C., which is large as compared with that of the above-mentioned each example.

Further, in the case of "1"/20>"L" as in Example 4, the temperature difference was large as compared with the temperature difference in the case of "1"/20<"L". Also, in the case of "L"<0.5 mm, also as in Example 5, the temperature difference was large as compared with that in the case of "L">0.5 mm.

INDUSTRIAL APPLICABILITY

As described above, according to a ceramic substrate for a semiconductor producing/examining device, since the region where a semiconductor wafer is placed exists inside the region where resistance heating element is formed, the temperature control of a semiconductor wafer placed on the ceramic substrate can be well performed by controlling the temperature of the resistance heating elements and thus the semiconductor wafer can be evenly heated.

What is claimed is:

1. A ceramic substrate for a semiconductor producing/examining device, comprising at least a resistance heating element formed on a surface thereof or inside thereof, wherein a region where a semiconductor wafer is directly placed or placed apart from the surface thereof while keeping a given distance exists within 0.5 mm or more inside of the outer end of a surface region where said resistance heating element is formed.

2. A ceramic substrate for a semiconductor producing/examining device, comprising at least a resistance heating element formed on a surface thereof or inside thereof, wherein a region where a semiconductor wafer is directly placed or placed apart from the surface thereof while keeping a given distance exists inside a surface region where said resistance heating element is formed, and the relationship between a distance "L" from the outer end of the surface region where said resistance heating element is formed to the outer end of the region where the semiconductor wafer is directly placed or placed apart from the surface thereof while keeping the given distance, and a thickness "1" of the ceramic substrate, satisfies the inequality of "L" (mm)>"1" (mm)/20.

* * * * *